United States Patent
Zhong et al.

(10) Patent No.: US 8,471,299 B2
(45) Date of Patent: Jun. 25, 2013

(54) LAYOUT AND PAD FLOOR PLAN OF POWER TRANSISTOR FOR GOOD PERFORMANCE OF SPU AND STOG

(75) Inventors: Guo Hua Zhong, Shenzhen (CN); Mei Yang, Shenzhen (CN)

(73) Assignee: STMicroelectronics (Shenzhen) R&D Co. Ltd., Shenzhen (CN)

( * ) Notice: Subject to any disclaimer, the term of this patent is extended or adjusted under 35 U.S.C. 154(b) by 115 days.

(21) Appl. No.: 12/861,678

(22) Filed: Aug. 23, 2010

(65) Prior Publication Data
US 2011/0074511 A1    Mar. 31, 2011

(30) Foreign Application Priority Data
Sep. 30, 2009    (CN) .......................... 2009 1 0253051

(51) Int. Cl.
*H01L 29/76*    (2006.01)
(52) U.S. Cl.
USPC ........... 257/213; 257/206; 257/401; 438/129; 438/599
(58) Field of Classification Search
USPC .......... 257/213, 401, 206, E27.013, E27.026, 257/E29.026, E29.07, E28.12, E23.07
See application file for complete search history.

(56) References Cited

U.S. PATENT DOCUMENTS

| | | | |
|---|---|---|---|
| 3,667,064 A * | 5/1972 | Thornton et al. ............. | 330/289 |
| 4,959,699 A | 9/1990 | Lidow et al. | |
| 4,974,059 A | 11/1990 | Kinzer | |
| 5,008,725 A | 4/1991 | Lidow et al. | |
| 5,023,189 A * | 6/1991 | Bartlow ............................. | 438/5 |
| 5,414,296 A * | 5/1995 | Bartlow ......................... | 257/579 |
| 5,631,483 A | 5/1997 | Ferla et al. | |
| 5,689,133 A * | 11/1997 | Li et al. ........................... | 257/361 |
| 5,841,167 A | 11/1998 | Grimaldi et al. | |
| 5,850,099 A * | 12/1998 | Liu ................................ | 257/469 |
| 6,097,071 A * | 8/2000 | Krakauer ....................... | 257/395 |
| 6,309,053 B1 * | 10/2001 | Torgerson et al. .............. | 347/59 |
| 6,372,586 B1 * | 4/2002 | Efland et al. .................. | 438/301 |
| 6,388,292 B1 * | 5/2002 | Lin ................................ | 257/356 |
| 6,522,203 B1 * | 2/2003 | Tiren et al. .................... | 330/295 |
| 6,740,930 B2 * | 5/2004 | Mattei et al. .................. | 257/329 |
| 6,750,517 B1 * | 6/2004 | Ker et al. ....................... | 257/401 |
| 6,927,458 B2 * | 8/2005 | Worley .......................... | 257/361 |
| 6,982,461 B2 * | 1/2006 | Hossain et al. ............... | 257/341 |
| 7,005,708 B2 * | 2/2006 | Mergens et al. ............... | 257/360 |
| 7,110,281 B1 * | 9/2006 | Voogel et al. ................. | 365/149 |
| 7,157,926 B1 * | 1/2007 | Hargrove et al. ........ | 324/756.02 |
| 7,301,796 B1 * | 11/2007 | Voogel et al. ................. | 365/149 |
| 7,414,275 B2 * | 8/2008 | Greenberg et al. ........... | 257/211 |
| 7,511,345 B2 * | 3/2009 | Van Camp et al. ........... | 257/355 |
| 7,788,611 B2 * | 8/2010 | Biondi et al. ................. | 716/102 |
| 7,882,482 B2 * | 2/2011 | Ueunten ....................... | 716/100 |
| 7,928,517 B2 * | 4/2011 | Tiemeijer ...................... | 257/401 |
| 8,002,169 B2 * | 8/2011 | Miller et al. .................. | 228/165 |
| 2002/0014670 A1 * | 2/2002 | Litwin .......................... | 257/401 |

(Continued)

*Primary Examiner* — Fernando L Toledo
*Assistant Examiner* — Mohammed Shamsuzzaman
(74) *Attorney, Agent, or Firm* — Seed IP Law Group PLLC

(57) ABSTRACT

A power transistor for use in an audio application is laid out to minimize hot spots. Hot spots are created by non-uniform power dissipation or overly concentrated current densities. The source and drain pads are disposed relative to each other to facilitate uniform power dissipation. Interleaving metal fingers and upper metal layers are connected directly to lower metal layers in the absence of vias to improve current density distribution. This layout improves some fail detection tests by 17%.

17 Claims, 6 Drawing Sheets

U.S. PATENT DOCUMENTS

| | | |
|---|---|---|
| 2002/0033507 A1* | 3/2002 | Verhaege et al. .............. 257/360 |
| 2002/0093056 A1* | 7/2002 | Cai et al. ........................ 257/355 |
| 2003/0117174 A1* | 6/2003 | Patel et al. ........................ 326/86 |
| 2004/0232484 A1* | 11/2004 | Zommer et al. ............... 257/341 |
| 2005/0029597 A1* | 2/2005 | Worley .......................... 257/355 |
| 2006/0035438 A1* | 2/2006 | Cunningham ................. 438/455 |
| 2006/0076647 A1* | 4/2006 | Naethe et al. .................. 257/573 |
| 2007/0120153 A1* | 5/2007 | Williams et al. ............... 257/280 |
| 2007/0187780 A1* | 8/2007 | Tiemeijer ...................... 257/401 |
| 2007/0210442 A1* | 9/2007 | Hess et al. .................... 257/700 |
| 2007/0241456 A1* | 10/2007 | Chao et al. .................... 257/734 |
| 2008/0237648 A1* | 10/2008 | Greenberg et al. ........... 257/211 |
| 2009/0019411 A1* | 1/2009 | Chandra et al. .................... 716/9 |
| 2009/0108459 A1* | 4/2009 | Motoyui ....................... 257/773 |
| 2009/0114912 A1* | 5/2009 | Large et al. ...................... 257/48 |
| 2009/0217228 A1* | 8/2009 | Melzner .......................... 716/10 |
| 2010/0155960 A1* | 6/2010 | Kanzaki et al. ............... 257/773 |
| 2010/0190277 A1* | 7/2010 | Lin et al. ......................... 438/17 |
| 2011/0182324 A1* | 7/2011 | Stoisiek et al. ............... 374/185 |

\* cited by examiner

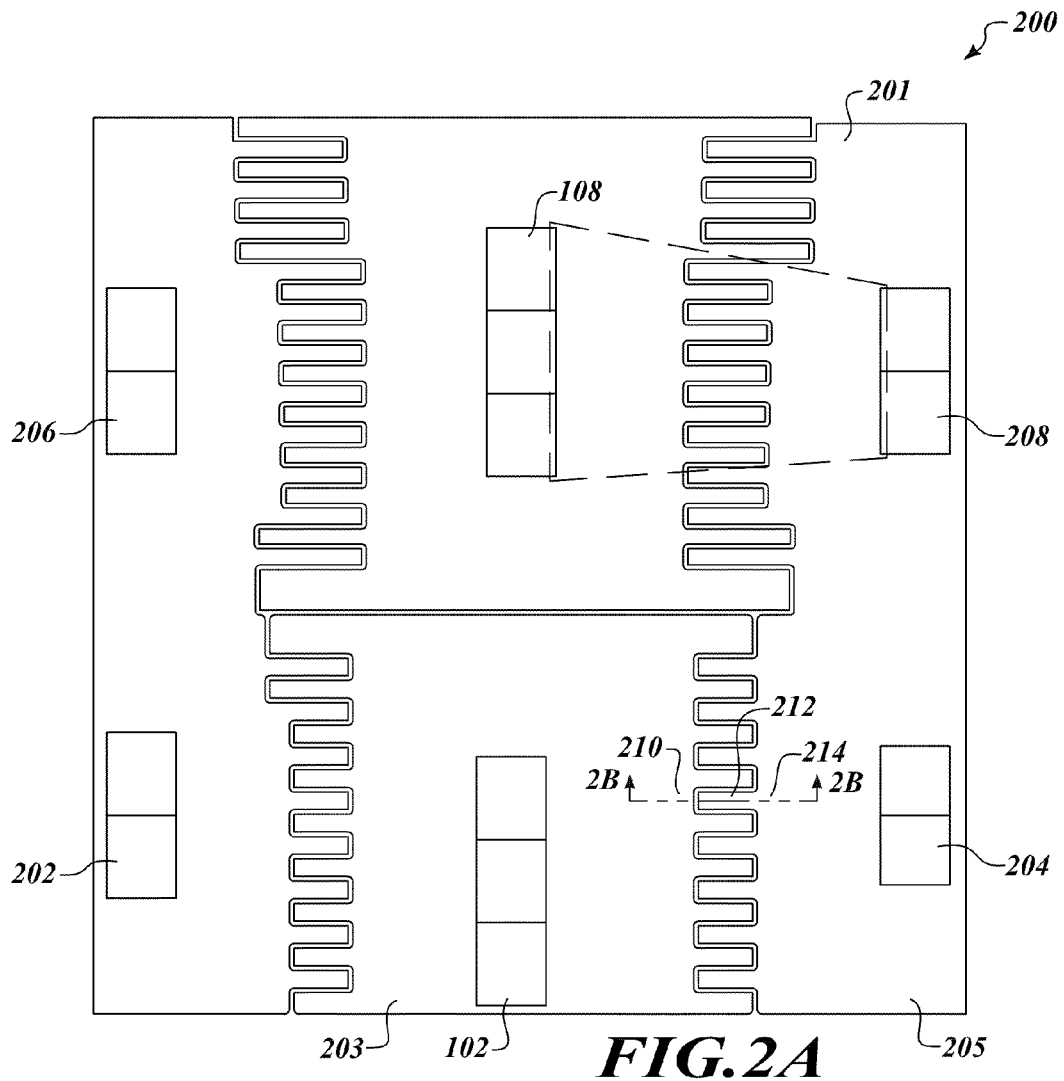
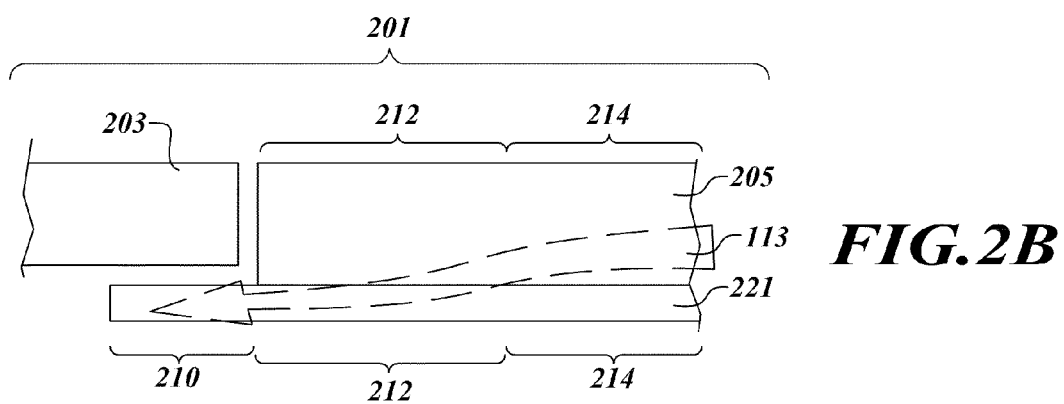

LAYOUT AND PAD FLOOR PLAN OF POWER TRANSISTOR FOR GOOD PERFORMANCE OF SPU AND STOG

BACKGROUND

1. Technical Field

The disclosure generally relates to the field of power transistors.

2. Description of the Related Art

Power circuits are generally susceptible to issues related to power dissipation, such as concentrated heat and current densities. Power dissipation, simply put, is the product of current flowing through a device that has some amount of resistance. The dissipation of power in a device over a period of time produces undesirable heat, which may, if in sufficient quantity, cause melting in portions of the device. Melting in semiconductor devices generally leads to operational failure.

Current density is a measurement of electric current through an area and can also lead to device malfunction. For example, when the path for current to flow becomes restricted to an area that is relatively small for the amount of current flowing, the current density increases. A sufficient increase in current density begins to break down the material through which the current is flowing. This breakdown, similar to undesirable amounts of heat, generally leads to device failure.

BRIEF SUMMARY

The following disclosure relates to a transistor with improved heat and current density disbursement. In one embodiment, metal layers associated with a source are interleaved with metal layers associated with a drain. The metal layers of this embodiment are interleaved with fingers of metal.

In another embodiment, the metal fingers include a lower metal layer and an upper metal layer, and the upper metal layer is deposited directly on the lower metal layer without the use of a via or inter-metal connector.

In one embodiment, pads for the source and drain are substantially parallel to one another so as to distribute the current density across a long edge of a source pad or a drain pad. Distributing the current density across a long edge of a source pad or a drain pad will increase the non-destructive current capacity of the transistor.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale or in the exact shape of the operating product.

FIG. 2A is a block diagram illustrating a power transistor layout, in accordance with an embodiment.

FIG. 2B is a view of a partial cross section of the power transistor layout of FIG. 2A.

FIG. 4 is a circuit diagram illustrating a short-to-plus unpowered transistor test, in accordance with an.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures and methods associated with integrated circuits and semiconductor manufacturing/packaging processes have not been shown or described in detail to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is, as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

Figure 1A:
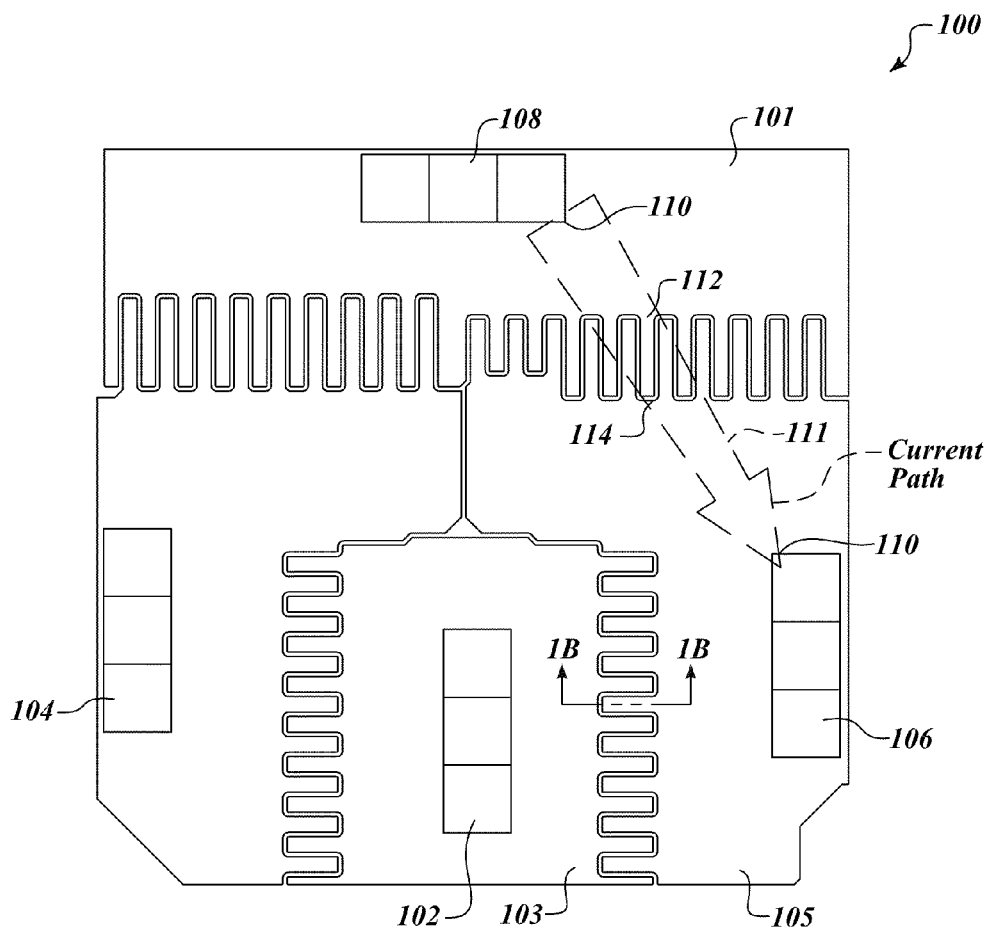
FIG. 1A is a block diagram illustrating a prior art power transistor layout.
Figure 1B:
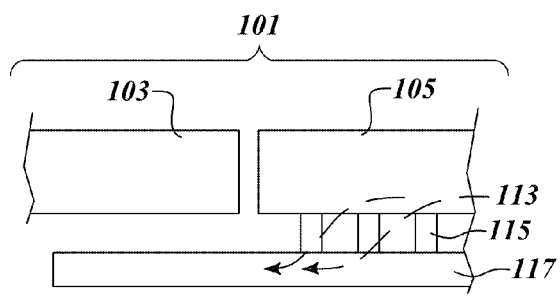
FIG. 1B is a view of a partial cross section the power transistor layout of FIG. 1A.

FIGS. 1A and 1B illustrate three hot spot locations that occur with power transistor layout 100. The hot spot locations depend upon the distance of fingers from pads, length of fingers, and placement of pads with respect to fingers. FIG. 1A shows a block diagram of the power transistor layout 100, which includes a source pad 102, a drain pad 104, a drain pad 106, and a source pad 108. The zig-zag lines of FIG. 1A represent interleaved fingers of a metal layer 101 and illustrate separation between the source metal layer bases surrounding the source pads and drain metal bases surrounding the drain pads. For example, as shown in FIG. 1A, source metal layer base 103 surrounds source pad 102 and drain metal layer base 105 surrounds drain pad 106.

Transistor layout 100 includes the sources and drains of four transistors. Two n-channel transistors extend from source pad 102. One n-channel transistor is formed between source pad 102 and drain pad 104. Another n-channel transistor is formed between source pad 102 and drain pad 106. Similarly, two p-channel devices extend from source pad 108. One p-channel transistor is formed between source pad 108 and drain pad 104. Another p-channel transistor is formed between source pad 108 and drain pad 106. FIG. 1A does not illustrate the gates of the transistors. Furthermore, the area surrounding the source and drain pads represent a metal layer that connects a source or drain of a transistor to a source or drain pad.

The large arrow 111 represents one of the four current paths and illustrates three points in which heat or current density may cause failure. Pad corner 110 represents a point near the corner of source pad 108. A least resistive path for current to flow from source 108 to drain 106 exists at pad corner 110. During operation of transistor layout 100, the corners of source pad 108, such as pad corner 110, are susceptible to becoming hot spots. Hot spots are locations where heat or current density increases the temperature of the metal layer at a location that may cause melting and lead to lower performance or inoperability of transistor layout 100.

The metal melting in transistor layout 100 is due to the Joule effect. An increase in current carried by the transistor during non-destructive tests, as will be described in association with FIGS. 3 and 4, creates hot spots at various locations on the shown metal layer 101. Pad positioning contributes to non-uniform current distribution and higher specific Joule effect due to local layout topology. At hot spots, the shown metal layer 101 and underlying metals start to melt. The melting metal interrupts the current path, and the current carried by this path becomes more concentrated. The sequence of metal melting and current becoming more concentrated eventually produces destructive results.

Metal finger base 112 illustrates a second potential hot spot. A base of a metal finger is the location at the metal layer from which a finger extends. Current entering metal finger base 112 transitions from a lower current density to a higher current density due to the current constricting and flowing through vias to lower metal layers. As discussed in association with the Joule effect, an increase in current concentration can create a hot spot at which the metal layer melts.

FIG. 1B is a view of a partial cross section the power transistor layout of FIG. 1A. This cross section represents the junction between interleaved metal fingers of the source metal layer base 103 of the shown upper metal layer 101 in FIG. 1A and drain metal layer base 105 of the shown metal layer 101 in FIG. 1A. Also shown is a lower metal layer 117 below the metal layer 101 shown in FIG. 1A. As current 113 flows from the drain metal layer base 105 through vias 115 to lower metal layer 117, one can more readily recognize the current concentration that occurs that may destroy the metal vias 115 at the regions located where the drain metal layer base 105 and source metal layer base 103 are adjacent to each other. Finger end 114 illustrates a third potential hot spot. This hot spot is due to major current density from the lower metal layer 117 passing through a via 115 to the upper metal layer 101 of FIG. 1A and FIG. 1B.

FIGS. 2A and 2B illustrate embodiments that mitigate the destructive effects of hot spots. Shown in FIG. 2A is block diagram of a power transistor layout 200 in accordance with one such embodiment. Transistor layout 200 includes source pad 102, drain pad 202, drain pad 204, drain pad 206, drain pad 208, and source pad 108. The zig-zag lines of FIG. 2A represent interleaved fingers of a metal layer 201 and illustrate separation between the source metal layer bases surrounding the source pads and drain metal bases surrounding the drain pads. For example, as shown in FIG. 2A, source metal layer base 203 surrounds source pad 102 and drain metal layer base 205 surrounds drain pad 204, and metal finger section 212 is an example of a metal finger section extending from drain metal layer base 205 interleaved with metal fingers extending from source metal layer base 203.

Power transistor layout 200 includes the sources and drains of four transistors. Two n-channel transistors extend from source pad 102. One n-channel transistor is formed between source pad 102 and drain pad 202. Another n-channel transistor is formed between source pad 102 and drain pad 204. Similarly, two p-channel devices extend from source pad 108. One p-channel transistor is formed between source pad 108 and drain pad 206. Another p-channel transistor is formed between source pad 108 and drain pad 208. FIG. 2A does not illustrate the gates of the transistors. Furthermore, the area surrounding the source and drain pads represent a metal layer that connects a source or drain of a transistor to a source or drain pad.

The four transistors can be coupled as full Complementary Metal Oxide Semiconductor (CMOS) output drivers, with their drains the n and p channel transistors coupled together to provide a high power output in a manner well known in the art. The power transistor layout 200 can be considered to be used having two legs, a first leg at the p and n channel transistors on one side and a second leg of the other p and n channel transistors on the other side.

FIG. 2B is a view of a partial cross section of the power transistor layout of FIG. 2A. This cross section represents the junction between interleaved metal fingers of the source metal layer base 203 of the shown upper metal layer 201 in FIG. 2A and drain metal layer base 205 of the shown upper metal layer 201 in FIG. 2A. In one embodiment, drain metal layer base 205 of the upper metal layer 201 is deposited directly on a lower metal layer 221, bypassing the use of via structures, at least in the region of the metal finger section 212. Alternatively, in another embodiment the upper drain metal layer base 205 is deposited directly on the lower metal layer 221 for most of the length of the metal finger section 212. The direct connection of drain metal layer base 205 of the shown upper metal layer 201 with lower metal layer 221 serves several functions.

Directly connecting the drain metal layer base 205 to lower metal layer 221 improves heat distribution resulting from power dissipation. Each oxide or silicon layer has a significant inherent thermal resistance. Analogous to current flowing through electrical resistance, thermal resistance impedes the flow of heat from one process layer to another. The separation of the drain metal layer base 205 from lower metal layer 221 by an interlayer dielectric, such as is shown in FIG. 1B, impedes the distribution of heat that is generated by power dissipated in the drain metal layer base 205. Ideally, generated heat will be conducted to the substrate to minimize the likelihood of altering or melting the electrically conductive metal structures. The disclosed embodiment of FIG. 2B which illustrates drain metal layer base 205 directly connected to lower metal layer 221 significantly reduces the thermal resistance between the metal layers and therefore reduces the risk of hot spots, which may occur in locations similar to those around pad corner 110 and finger base 112 shown in FIG. 1A.

Directly connecting drain metal base layer 205 to lower metal layer 221 reduces current density issues. Metal finger section 210 of lower metal layer 221 extends beneath source metal layer base 203. Not shown is a lower source metal finger portion which also extends beneath drain metal layer base 205. Metal finger section 212 comprises an overlap of drain metal layer base 205 and lower metal layer 221. Base plate section 214 illustrates an overlap of drain metal layer base 205 and lower metal layer 221 in the metal layer from which the metal finger section 212 protrudes. The overlap of drain metal layer base 205 and lower metal layer 221 at metal finger section 212 and base plate section 214 distributes the current flowing through the finger so as to reduce the current density. In the absence of either the metal finger section 212 or the base plate section 214, the maximum total current value is significantly reduced.

The following equations explain the function of the power geometry. The current flowing through base plate section 214 can be represented as:

$$IMx = (I_{finger\ 210}/(2*I_{finger\ 210} + I_{finger\ 212}) * I,$$

where,

I=total current
$I_{finger\ 210}$=the current through metal finger section 210, and
$I_{finger\ 212}$=the current through metal finger section 212.
The total current I is equal to the current through finger section 210 and 212 as well as base plate section 214. The current through base plate section 214 is represented by:

$$IMx=[1-I_{finger\ 210}/(2*I_{finger\ 210}+I_{finger\ 212})]*I.$$

In one embodiment, the ratio of the length of metal finger section 212 divided by metal finger section 210 is between 1.7 and 2.1.

Figure 3:
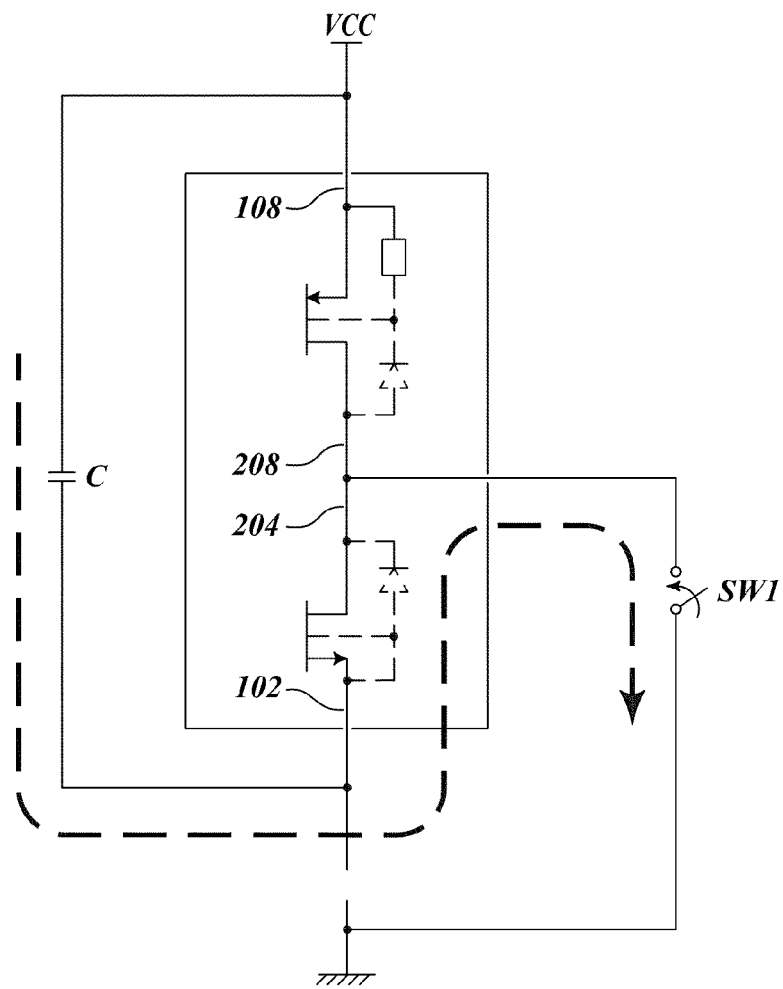
FIG. 3 is a circuit diagram of an open ground transistor test, in accordance with an embodiment.

FIG. 3 illustrates subjecting one leg of power transistor layout 200 to a short to open ground ("STOG") test. The STOG test simulates the floating ground that may occur in car audio applications of a power transistor in one use of an embodiment of transistor layout 200. A floating ground in a car audio application may damage a power transistor by forward biasing a parasitic pn junction inherent in mosfet devices. In the STOG test, the capacitor C is precharged with a voltage, a switch SW1 is opened some time thereafter, and the parasitic body-drain pn junction of the n-channel device is forward biased. In one embodiment, the C is charged to 16.5 volts to perform the STOG test. The embodiment of transistor layout 200 more evenly dissipates power and disperses current density so as to effect approximately a 17% increase over the prior art in the voltage level that can be applied to transistor layout 200 without damaging the device.

Figure 4:
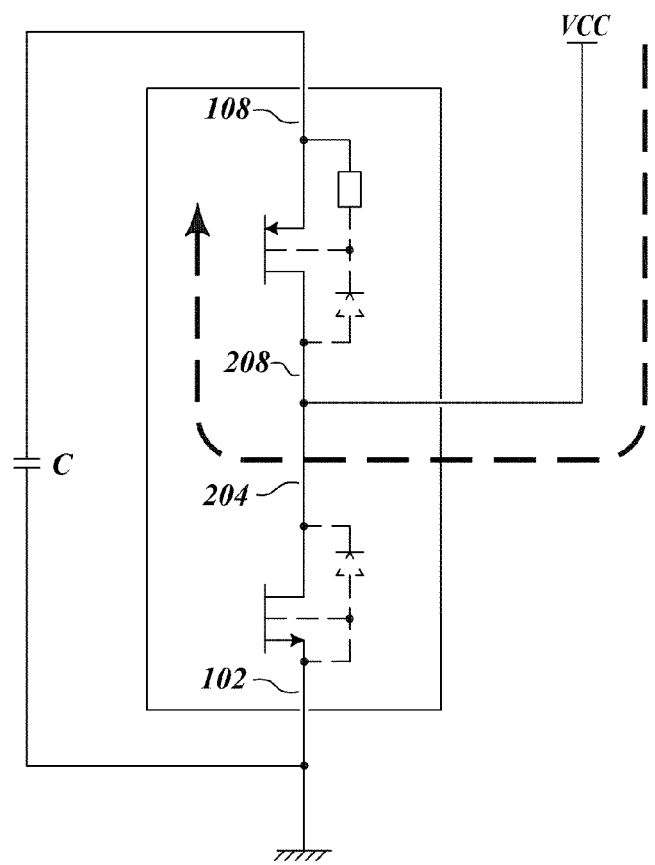

FIG. 4 illustrates subjecting one leg of power transistor layout 200 to a short to plus unpowered ("SPU") test. The SPU test simulates the charging of a capacitive load, such as speakers with the needed interconnecting wires, followed by the sudden loss of the power supply to transistor layout 200. In such an event, the pn junction of the p-channel device would become forward biased and begin conducting. The SPU test evaluates the strength of the p-channel device to withstand such undesirable conditions. The embodiment illustrated by transistor layout 200 demonstrates approximately a 14% improvement over the prior art for the SPU test. In one embodiment, a charged capacitive load is simulated by applying 16.5 volts to drain pad 208 for the SPU test without damaging the device.

Figure 5:
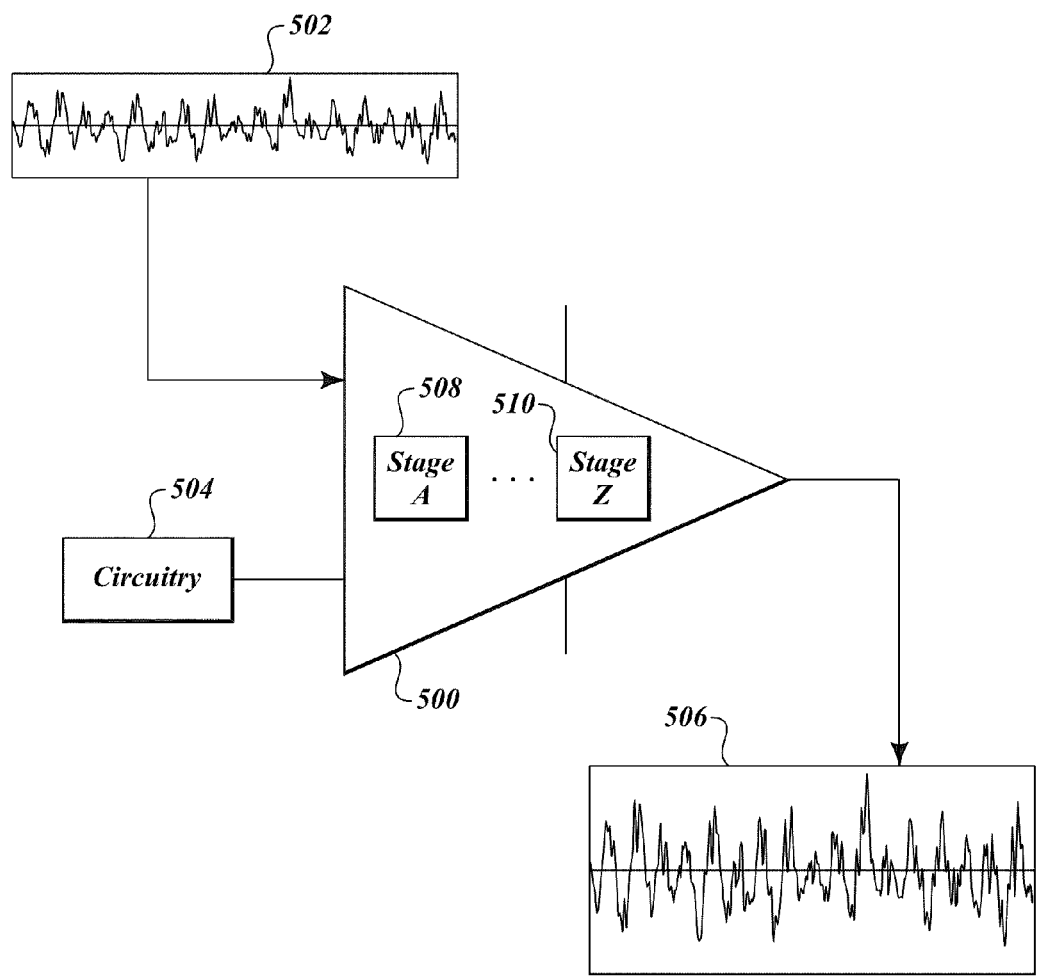
FIG. 5 is a circuit diagram illustrating an amplifier application of a transistor, in accordance with an embodiment.

FIG. 5 illustrates power transistor layout 200 (shown in FIGS. 2A and 2B) being used in one or more stages of an audio amplifier having audio input 502 and additional input from circuitry 504, and an amplified audio output 506, in accordance with an embodiment. In one embodiment transistor layout 200 is a first stage A 508 of an audio amplifier 500. In another embodiment, transistor layout 200 is a last stage Z 510 of an audio amplifier. In yet another embodiment transistor layout 200 is one or more stages between the first and the last stages of an audio amplifier.

A few points are noted regarding the upper metal layers 101 and 201 shown in FIGS. 1A and 2A, respectively, and the lower metal layers 117 and 221 shown in FIGS. 1B and 2B, respectively. The thermal resistance of metal layers 117 and 221 is lower than the one seen from metal layers 101 and 201, and in an optimal case the increment is about 9%. The metal electrical resistance plays a major role. A safe point on the analysis is that the Joule effects increase the metal temperature. The vias 115 between metal metal layer 117 and metal and metal layer 101 are a source of electrical power because the current flowing from source to drain passes through them and concentrates on the finger-end zone. The metal plates around the pads (e.g., source metal layer base 103 surrounding source pad 102 and drain metal layer base 105 surrounding drain pad 106) are useful to make the current more uniform for power dissipation.

It is desirable to exploit as much of the lower metal layer 221 as possible to use its vantage to better dissipate energy and impose on it the optimal current with respect to the Joule effect. A way to use this vantage is to join, where possible, metal layer 221 with metal layer 201. Several advantages include: metal layer 201 is better capable of dissipating energy, it increases the via number to the maximum (full plate), and it reduces the current which pass from metal layer 201 to metal layer 221 through the via at the finger-end.

It may also be advantageous to have a metal plate around the pad (e.g., drain metal layer base 205 surrounds drain pad 204) in order to get more uniform current to avoid concentrating current on the finger. Having a K factor around 0.67 at the finger end is also advantageous. In terms of the ratio between the length of metal finger section 212 plus the length of base plate section 214, which is the overlap of drain metal layer base 205 and lower metal layer 221, divided by the length of metal finger section 210 of lower metal layer 221 overlapping source metal layer base 203, an advantageous ratio is ~1.8. Note a way to verify the ratio is through simulation, even if locally, a rule of thumb could be to measure the ratio between finger length and plate length. Practically, a ratio close to 1.8 gives a finger length that leads to enough area of metal plate around the source of the drain pad. Better connections to the pad come from exploiting lower metal layer 221.

Lastly, maximizing the finger pitch may be desirable in order to reduce the percentage of oxide between the fingers. It is advantageous give attention to the limit of metal electro-migration of the fingers. In one embodiment, the finger pitch is 12 um, while the spacing between the finger is 4 um. Such dimensions would produce the following result:

efficiency=8 um finger metal/12 um pitch=67%.

In another embodiment a pitch of 50 um is used with a spacing of 4 um in order to have:

efficiency=46 um/50 um=92% with an increasing of 25% of current capability of the finger-base.

Figure 6A:
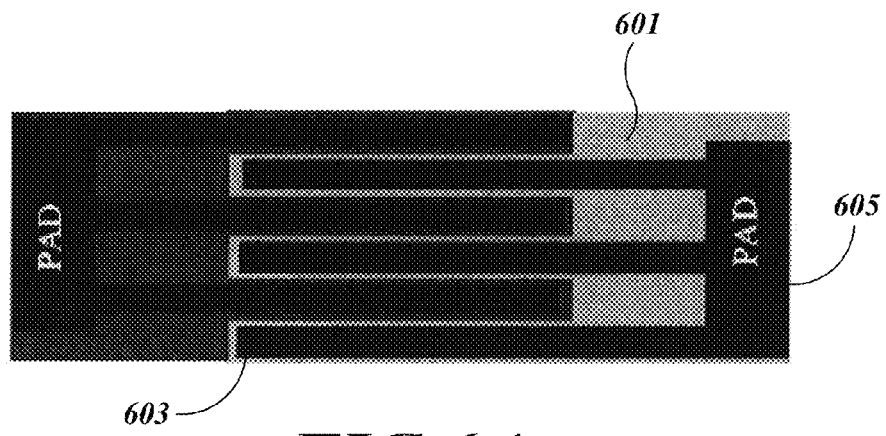
FIGS. 6A, 6B, and 6C are block diagrams representing a layout of a portion of the power transistor, in accordance with an embodiment.

FIG. 6A is a block diagram representing a layout of a portion of the power transistor, in accordance with an embodiment. In FIG. 6A a plate of aluminum 601 is deposited along the lower metal layer in order to connect lower metal layer with an upper metal layer. The pitch of the finger 603 is 50 um. The finger overlap length plus finger length divided by finger overlap ratio is about 1.8. The finger 603 is connected to the pad 605.

Figure 6B:
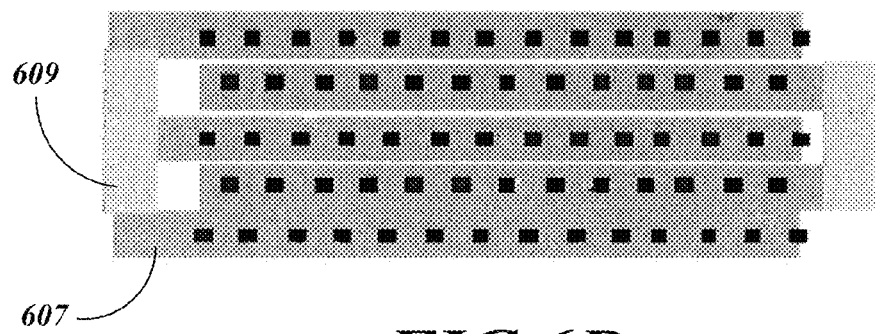

FIG. 6B illustrates the finger 607 connected to the source or drain pad 609, in accordance with an embodiment.

Figure 6C:
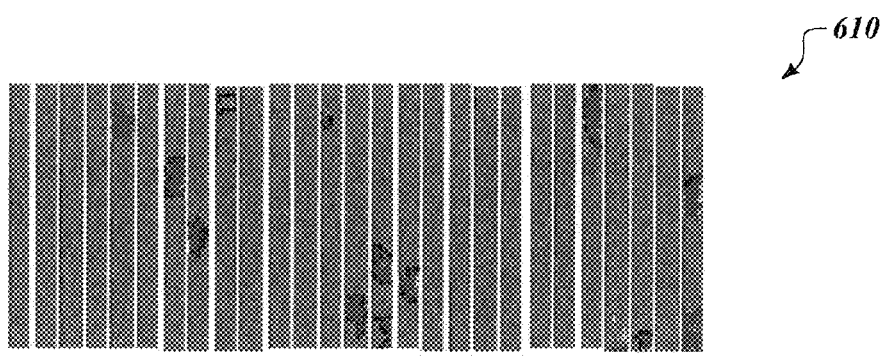

FIG. 6C illustrates an example orientation 610 of metal of the fingers, in accordance with an embodiment.

The foregoing detailed description has set forth various embodiments of the devices and/or processes via the use of block diagrams, schematics, and examples. Insofar as such block diagrams, schematics, and examples contain one or more functions and/or operations, it will be understood by those skilled in the art that each function and/or operation within such block diagrams, flowcharts, or examples can be implemented, individually and/or collectively, by a wide range of hardware, software, firmware, or virtually any combination thereof.

The various embodiments described above can be combined to provide further embodiments. From the foregoing it will be appreciated that, although specific embodiments have been described herein for purposes of illustration, various modifications may be made without deviating from the spirit and scope of the teachings. Accordingly, the claims are not limited by the disclosed embodiments.

We claim:

1. A power transistor layout, comprising:
   a first source pad;
   a first drain pad disposed substantially parallel to the first source pad to facilitate uniform power dissipation;
   a first source metal base coupled to the first source pad, wherein a first side of the first source metal base includes interleaving metal fingers;
   a first drain metal base coupled to the first drain pad, wherein a side of the first drain metal base adjacent to the first source metal base includes interleaving metal fingers protruding from the first drain metal base, the interleaving metal fingers of the first drain metal base being interleaved with the interleaving metal fingers of the first side of the first source metal base;
   a lower metal layer below the first drain metal base and the first source metal base, the first drain metal base being positioned directly on a first portion of the lower metal layer and the first source metal base being positioned overlying a second portion of the lower metal layer, the second portion of the lower metal layer being a metal finger that partially extends beneath the first source metal base;
   a second drain pad coupled to the first drain metal base and spaced apart from the first drain pad;
   a second source pad disposed substantially parallel to the second drain pad, the first drain pad being closer to the first source pad than to the second source pad, the second drain pad being closer to the second source pad than to the first source pad; and
   a second source metal base coupled to the second source pad.

2. The power transistor layout of claim 1 further comprising:
   a third drain pad disposed substantially parallel to the first source pad to facilitate uniform current flow between the first source pad and the third drain pad; and
   a second drain metal base coupled to the third drain pad.

3. The power transistor layout of claim 2 further comprising:
   a fourth drain pad coupled to the second drain metal base, the fourth drain pad being disposed substantially parallel to the second source pad to facilitate uniform current flow between the second source pad and the fourth drain pad.

4. The power transistor layout of claim 3 wherein the second source metal base includes a first side of interleaving metal fingers adjacent to and interleaved with the interleaving metal fingers of the side of the first drain metal base.

5. The power transistor layout of claim 4 wherein the second drain metal base includes interleaving metal fingers along one side, wherein the first source metal base includes a second side of interleaving fingers adjacent to and interleaved with the interleaving metal fingers of the one side of the second drain metal base, and wherein the second source metal base includes a second side of interleaving metal fingers adjacent to and interleaved with the interleaving metal fingers of the one side of the second drain metal base.

6. The power transistor layout of claim 5 wherein the first source metal base at least partially rests directly on a lower metal layer.

7. The power transistor layout of claim 6 wherein the interleaving metal fingers of the first side of the first source metal base and the interleaving metal fingers of the first side of the second source metal base rest directly on a lower metal layer.

8. The power transistor layout of claim 6 wherein the interleaving metal fingers of the side of the first drain metal base and the interleaving metal fingers along the one side of the second drain metal base rest directly on a lower metal layer.

9. The power transistor layout of claim 1 further comprising a lower metal layer disposed below the first source and first drain metal bases.

10. The power transistor layout of claim 9 wherein the lower metal layer includes a first source and a first drain, the lower metal layer first source having metal fingers that partially extend beneath the first drain metal base, and the lower metal layer first drain including metal fingers that partially extend beneath the first source metal base.

11. An audio amplifier, comprising:
    an input connection;
    an amplifier stage coupled to the input connection to increase a received input, the amplifier stage including a power transistor, the power transistor including:
      a first source pad;
      a first drain pad disposed substantially parallel to the first source pad to facilitate uniform power dissipation;
      a first source metal base coupled to the first source pad, wherein a first side of the first source metal base includes interleaving metal fingers;
      a first drain metal base coupled to the first drain pad, wherein a side of the first drain metal base adjacent to the first source metal base includes interleaving metal fingers protruding from the first drain metal base, the interleaving metal fingers of the first drain metal base being interleaved with the interleaving metal fingers of the first side of the first source metal base;
      a lower metal layer below the first drain metal base and the first source metal base, the first drain metal base being positioned directly on a first portion of the lower metal layer and the first source metal base being positioned overlying a second portion of the lower metal layer, the second portion of the lower metal layer being a metal finger that partially extends beneath the first source metal base;
      a second drain pad coupled to the first drain metal base; and
    an output coupled to the amplifier stage.

12. The audio amplifier of claim 11 further comprising: a lower metal layer, the lower metal layer including a first source and a first drain, wherein the first source metal base partially rests directly on the first source of the lower metal layer instead of vias, and the first drain metal base partially rests directly on the first drain of the lower metal layer.

13. The audio amplifier of claim 11 further comprising:
    a second source pad disposed substantially parallel to the second drain pad; and
    a second source metal base coupled to the second source pad.

14. The audio amplifier of claim 11 further comprising:
    a third drain pad disposed substantially parallel to the first source pad to facilitate uniform current flow between the first source pad and the third drain pad; and
    a second drain metal base coupled to the third drain pad.

15. The audio amplifier of claim 14 further comprising:
    a fourth drain pad coupled to the second drain metal base, the fourth drain pad being disposed substantially parallel to the second source pad to facilitate uniform current flow between the second source pad and the fourth drain pad.

16. The power transistor layout of claim 1, wherein the power transistor layout is configured to:
   pass a first current from the first source pad to the first drain pad; and
   pass a second current from the second drain pad to the second source pad.

17. The power transistor layout of claim 16 wherein the power transistor layout is configured to pass the first current from the first source metal base to the lower metal layer.

* * * * *